(12) United States Patent
Britton

(10) Patent No.: US 9,281,686 B2
(45) Date of Patent: Mar. 8, 2016

(54) STATE ESTIMATION FOR COOPERATIVE ELECTRICAL GRIDS

(71) Applicant: Alstom Grid, Inc., Redmond, WA (US)

(72) Inventor: Jay Payne Britton, Seattle, WA (US)

(73) Assignee: General Electric Technology GmbH, Baden (CH)

(*) Notice: Subject to any disclaimer, the term of this patent is extended or adjusted under 35 U.S.C. 154(b) by 454 days.

(21) Appl. No.: 13/670,073

(22) Filed: Nov. 6, 2012

(65) Prior Publication Data

US 2014/0129204 A1    May 8, 2014

(51) Int. Cl.
*H02J 3/00* (2006.01)

(52) U.S. Cl.
CPC ............. *H02J 3/00* (2013.01); *H02J 2003/007* (2013.01); *Y02E 60/76* (2013.01); *Y04S 40/22* (2013.01)

(58) Field of Classification Search
CPC .. G06F 17/50; G06F 17/504; H02J 2003/007; H02J 3/00; H02J 3/008; H02J 3/1814; G01R 25/00; G01R 27/06; G05B 17/02; G05B 13/02; H04L 29/08846
USPC .......................................................... 703/13
See application file for complete search history.

(56) References Cited

U.S. PATENT DOCUMENTS

| | | | | |
|---|---|---|---|---|
| 7,710,729 B2* | 5/2010 | Li | ........................... | G01R 27/16 361/720 |
| 8,738,191 B2* | 5/2014 | Aivaliotis | ................. | H02J 3/00 700/286 |
| 9,014,867 B2* | 4/2015 | Divan | .................... | G05B 13/02 700/297 |
| 2005/0160128 A1* | 7/2005 | Fardanesh | ............. | G06F 17/504 708/446 |
| 2008/0177425 A1* | 7/2008 | Korba | ................... | H02J 3/1814 700/297 |
| 2008/0281437 A1* | 11/2008 | Korba | .................... | G05B 17/02 700/22 |
| 2009/0228154 A1* | 9/2009 | Trias | ............................. | 700/295 |
| 2010/0152910 A1* | 6/2010 | Taft | ........................ | G01R 25/00 700/286 |
| 2011/0208366 A1* | 8/2011 | Taft | ................... | H04L 29/08846 700/295 |
| 2011/0307109 A1* | 12/2011 | Sri-Jayantha | ................. | 700/291 |
| 2012/0022707 A1* | 1/2012 | Budhraja | ............... | H02J 3/008 700/292 |
| 2012/0022713 A1* | 1/2012 | Deaver, Sr. | ............ | G05B 17/02 700/298 |
| 2013/0079943 A1* | 3/2013 | Darden, II | .............. | G06Q 50/06 700/297 |

OTHER PUBLICATIONS

Zhu, etal "Investigation of Data Exchange Requirements for Cooperative Grid Planning and Operation", 2011, Power Systems Computation Conference (PSCC 2011).*

(Continued)

*Primary Examiner* — Kandasamy Thangavelu
(74) *Attorney, Agent, or Firm* — Amin, Turocy & Watson, LLP

(57) ABSTRACT

Aspects of state estimation for cooperative electrical grids are disclosed. State estimation of a local electrical grid can be based on a local grid model and local electrical grid information. The local state estimation can reflect interactions and interconnections with other electrical grids by determining state estimation solution information based on the local grid model, local electrical grid information, and remote state estimator solution information associated with the other electrical grid. As such, a local state estimator can be configured to receive and employ remote state estimator solution information. This can be in addition to the more conventional technique or receiving a remote grid model and remote electrical grid information to estimate the conditions of the remote electrical grid. Further, state estimation solution information can be incremental to further reduce the amount of information to be transferred and the time needed to accomplish transmission of the information.

25 Claims, 10 Drawing Sheets

(56) References Cited

OTHER PUBLICATIONS

Monticelli, A. "Electric power system state estimation" Proceedings of the IEEE 88.2 (2000): 262-282.*

Britton, J. P. "Designing model exchange processes with CIM and RMA sets", Power Systems Conference and Exposition, 2006. PSCE'06. 2006 IEEE PES. IEEE, 2006.*

* cited by examiner

STATE ESTIMATION FOR COOPERATIVE ELECTRICAL GRIDS

TECHNICAL FIELD

The present application relates generally to electrical grids, and more particularly, to state estimation for electrical grids.

BACKGROUND

Traditional electrical grids, including distribution and transmission systems, employ state estimation as a tool for efficient operation of the subject electrical grid or portions thereof. As an electrical grid becomes larger and more complex, and especially as it becomes an interconnected grid in which portions of the grid are owned or operated by different parties, state estimation increases in complexity. In the conventional approach to state estimation for an interconnected grid, each party in the grid performs state estimation of their own portion of the grid plus adjacent portions that can affect their portion. Each state estimator that covers a portion of the grid typically has a computer model of that portion plus measurements for that portion. Each such state estimator will get different answers to the extent that models or measurements are not properly synchronized. Maintaining synchronization, especially of models, can be very challenging. It can require constant attention to maintain high quality models. The owner or operator for a given portion of the grid may be the only party that is in a good position to maintain the part of the model that represents their portion of the grid. In current practice, most state estimators have high quality models limited to their owner/operator's portion of the grid, and poorer quality models for other portions of the grid.

The above-described deficiencies of traditional electrical grids are merely intended to provide an overview of some of the problems of conventional technologies, and are not intended to be exhaustive. Other problems with conventional technologies and corresponding benefits of the various non-limiting embodiments described herein may become further apparent upon review of the following description.

SUMMARY

The following presents a simplified summary of the disclosed subject matter in order to provide a basic understanding of some aspects of the disclosed subject matter. This summary is not an extensive overview of the subject disclosure. It is intended to neither identify key or critical elements of the subject disclosure nor delineate the scope of the disclosed subject matter. Its sole purpose is to present some concepts of the disclosed subject matter in a simplified form as a prelude to the more detailed description that is presented later.

One or more embodiments of the disclosed subject matter illustrate state estimation for cooperative electrical grids. A system facilitating state estimation for cooperative electrical grids can include a memory and processor. The memory can store computer-executable instructions such that the processor can execute the instructions to at least determine a first state estimator solution information. The determination of the first state estimator solution information can be based on a first model of a first electrical grid, first electrical grid information associated with the first electrical grid, and second state estimator solution information associated with a second electrical grid.

In another non-limiting aspect, a method is disclosed that can facilitate state estimation for cooperative electrical grids. The method can include receiving a first model of a first electrical grid. The method can then include determining a first state estimator solution information. The determining can be based on the first model, first electrical grid information associated with the first electrical grid, and second state estimator solution information associated with a second electrical grid.

A further embodiment of the disclosed subject matter can include a computer-readable storage medium having computer-executable instructions stored thereon that, in response to execution, cause a computing device including a processor to perform operations to facilitate state estimation for cooperative electrical grids. The instructions can include receiving a first model of a first electrical grid, receiving electrical grid information associated with the first electrical grid, and receiving second state estimator solution information associated with a second electrical grid. The instructions can further include determining a first state estimator solution information. The determining can be based on the first state estimator model, the electrical grid information, and the second state estimator solution information.

To the accomplishment of the foregoing and related ends, the disclosed subject matter, then, comprises the features hereinafter fully described. The following description and the annexed drawings set forth in detail certain illustrative aspects of the disclosed subject matter. However, these aspects are indicative of but a few of the various ways in which the principles of the disclosed subject matter may be employed. Other aspects, advantages and novel features of the disclosed subject matter will become apparent from the following detailed description of the disclosed subject matter when considered in conjunction with the drawings.

DETAILED DESCRIPTION

Figure 1:
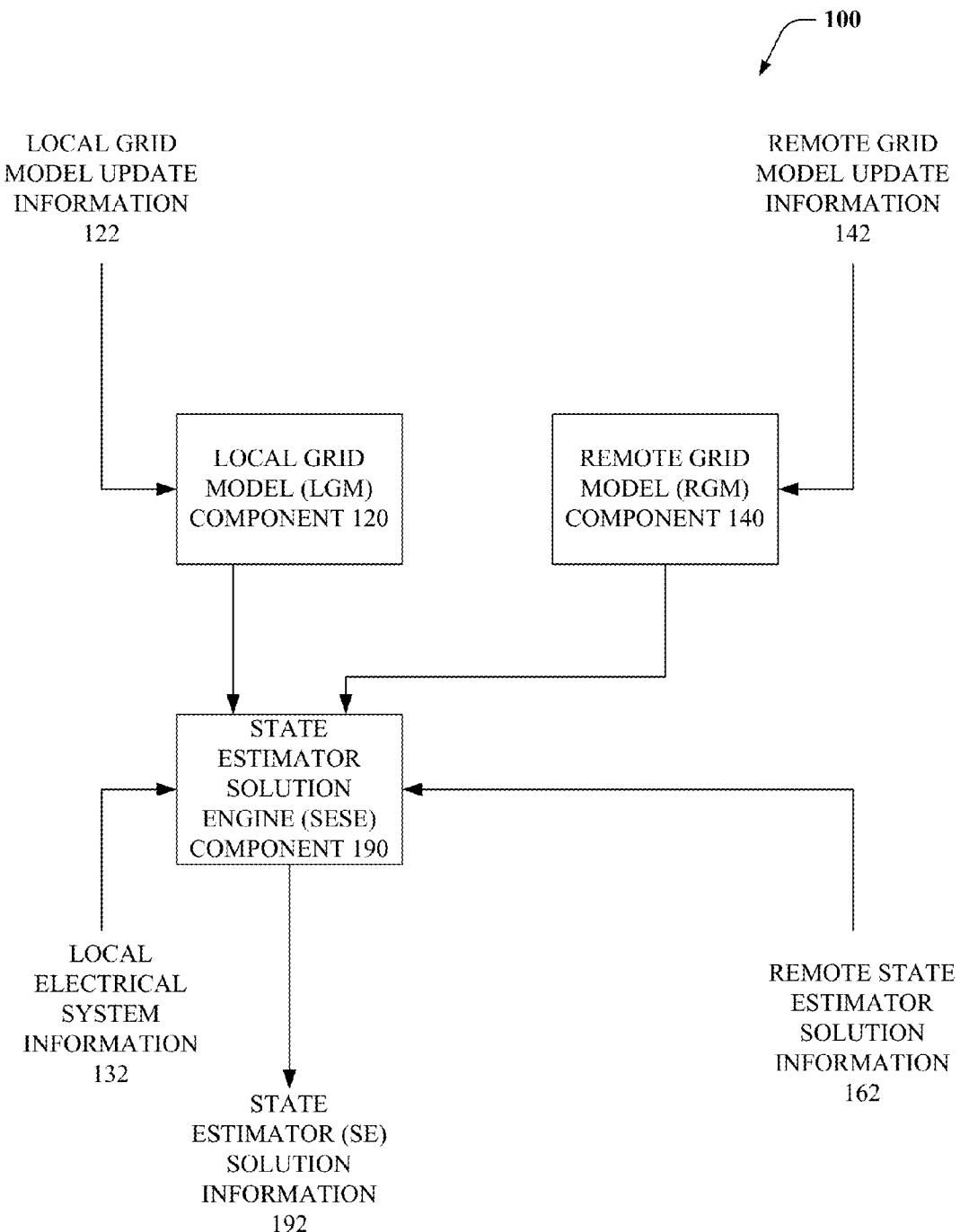
FIG. 1 illustrates a diagram of a system for state estimation for cooperative electrical grids in accordance with aspects of the disclosed subject matter.

The disclosed subject matter is now described with reference to the drawings, wherein like reference numerals are used to refer to like elements throughout. In the following description, for purposes of explanation, numerous specific details are set forth in order to provide a thorough understanding of the disclosed subject matter. It may be evident, however, that the disclosed subject matter may be practiced without these specific details. In other instances, well-known structures and devices are shown in block diagram form in order to facilitate describing the disclosed subject matter.

Traditional electrical grid systems can employ state estimation as a tool for efficient operation of the subject electrical grid. As used herein, the term grid can encompass grids of any level of granularity and, as such, the term grid can refer to an entire electrical grid across all connections or to any one or more subsets of an entire grid. As an example, the term electrical grid can describe the electrical interconnections spanning the Western United States. As a second example, the term electrical grid can describe the electrical connections managed by a first electrical grid operator that is a subset of the electrical grid spanning the Western US. Further, the term "electrical grid," as used herein, can mean an interconnected network for delivering electricity from suppliers to consumers and can encompass terms such as "electrical transmission" system, "electrical distribution" system, "electrical power" systems, or the like, and can still be of any level of granularity, e.g., local, city, county, state, multi-state, regional, national, inter-national, global, etc.

A state estimator (SE) can be a system that determines the state of the electrical grid based on models of a real electrical grid system. As such, a state estimator can provide an avenue to estimate the internal state of the modeled system. A state estimator can typically comprise a computer-implemented mathematical model. As an electrical grid becomes larger and more complex, state estimation of that system also generally increases in complexity. It is generally accepted that complex SEs have increased operational costs and can be subject to errors that can result in insecure operating conditions.

Additional complexity can be injected into state estimation of an electrical grid where there is a plurality of cooperative electrical grids. The term "cooperative" as applied to electrical grids indicates that a "cooperative" electrical grid is generally tied to another electrical grid and, as such, changes in the condition of either electrical grid can affect the performance of the other. As such, cooperative electrical grid (CEG) operators can have an interest in knowing both the internal state of their own electrical grid and the internal state of any cooperating electrical grids. CEGs can inherently increase the complexity of state estimation related to the cooperating grids.

Conventional techniques for state estimation of CEGs can include attempts at large-scale state estimation of all CEGs in a single model. However, this technique is often subject to problems such as out-of-date grid models, synchronization of measurements, state data, massive complexity, etc., generally resulting in higher operating costs and error-prone state estimation. Other conventional techniques include sharing of grid models among CEGs specifically to allow each operator to run a SE based, at least in part, on the shared grid model and their own grid model. However, shared grid models can become rapidly stale or out-of-date, e.g., changes in an electrical grid can fail to propagate to a shared grid model in a timely manner causing a state estimator to be less accurate because of the use of the stale grid model.

In contrast to conventional SE techniques, the presently disclosed subject matter includes sharing of up to date SE results between CEGs. This can be in addition to sharing grid models. In some circumstances, measurements of an electrical grid can also be shared in addition to the corresponding SE results, an up to date grid model, etc. As an example, in a CEG environment comprising two grids, a first CEG can provide the results of their internal SE to a second CEG and the second CEG can reciprocate. Thus, the first CEG can incorporate the second CEG's SE results when computing the next state estimation of the first CEG's electrical grid. Similarly, the second CEG can extend their grid model to employ the shared first CEG's SE results when determining their next iteration of state estimation for second CEG's electrical grid. Further, sharing SE solution information, e.g., SE results, does not preclude conventional sharing of grid models or inclusion in large-scale grid models, in addition to sharing SE solution information among CEGs as presently disclosed.

FIG. 1 illustrates a diagram of a system 100 of state estimation for cooperative electrical grids in accordance with aspects of the disclosed subject matter. System 100 can include local grid model (LGM) component 120. LGM component 120 can include a LGM of a first real world electrical grid. LGM component 120 can receive local grid model update information 122 to update the LGM. LGM component 120 can facilitate access to a LGM. LGM component 120 can be communicatively coupled to state estimator solution engine (SESE) component 190.

System 100 can further include remote grid model (RGM) component 140. RGM component 140 can include a RGM of a second real world electrical grid. RGM component 140 can receive remote grid model update information 142 to update the RGM. RGM component 140 can facilitate access to a RGM. RGM component 140 can be communicatively coupled to SESE component 190.

SESE component 190 can receive a LGM, e.g., by way of LGM component 120. SESE component 190 can further receive local electrical system information 132. SESE component 190 can determine state estimator solution information 192 based, at least in part, on the LGM and the local electrical system information 132. Where SESE component 190 determines SE solution information 192 based on the LGM and the local electrical system information 132, the SE solution information 192 can reflect state estimation of the first electrical grid.

Further, SESE component 190 can receive remote SE solution information 162. Remote SE solution information, for example, can be generated by state estimators associated with a second electrical grid and/or second electrical grid operators. As such, the remote SE solution information can be received by SESE component 190 independent of a RGM. SESE component 190 can determine state estimator solution information 192 based, at least in part, on remote SE solution information 162. Where SESE component 190 determines SE solution information 192 based on remote SE solution information 162, SE solution information 192 can reflect state estimation of the first electrical grid relative to effects from the second electrical grid.

SESE component 190 can further receive a RGM, e.g., by way of RGM component 140. SESE component 190 can further receive remote electrical system information (not illustrated), e.g., remote electrical grid measurements corresponding to the received RGM. In an aspect, remote electrical system information can be received by way of RGM component 140. SESE component 190 can determine state estimator solution information 192 based, at least in part, on a RGM and remote electrical system information. Where SESE component 190 determines SE solution information 192 based on remote SE solution information 162, the RGM, and the remote electrical system information, SE solution information 192 can reflect state estimation of the first electrical grid relative to effects from a second electrical grid.

In an aspect, SESE component 190 can determine SE solution information 192 based on combinations of a LGM, local electrical system information 132, a RGM, or remote electrical system information, and remote SE solution information 162. Employing remote SE solution information 162 in determining SE solution information 192 allows CEGs to maintain their respective grid models and share solutions to those grid models. Generally, a CEG operator can maintain their own grid models because it can directly affect their own electrical grid operations. Thus, rather than "racing to the bottom" where a shared model is maintained at the lowest cost, sharing SE solution information can actually create an environment where operators are motivated to maintain their grid models well.

Conventional grid model sharing techniques can generally rely on present grid measurements being applied to an older shared grid model, for example, an instant voltage measurement from a remote electrical grid can be employed by an older shared grid model to model the tap level of a generator that is part of the remote electrical grid. Where remote grid models are infrequently updated however, an example of a conventional grid model sharing technique can include an instant measurement being applied to a much older shared grid model. Where the much older shared grid model can be significantly out-of-date, it is possible that the resulting SE solutions are correspondingly inaccurate.

In contrast to conventional systems, the presently disclosed subject matter can employ older remote SE solution information in determinations of instant local SE solution information. Wherein CEG operators are motivated to maintain their own grid models, it can be expected that an older remote SE solution information is correspondingly accurate for the associated time period. The sharing of SE solution information can be viewed as simply sharing at least a portion of the solution information each CEG operator is independently generating for internal use and, as such, that the shared SE solution information will typically be relatively recent and less likely to be stale in comparison to the conventional sharing of shared grid models. In more pedestrian terms, it can generally be seen that a shared grid model may be weeks or months old and not an accurate representation of an electrical grid in comparison to sharing internal SE solution information of the last period, which can be just minutes or hours old. Instant SE solution information can be based on a grid model, corresponding grid measurements and SE solution result from a prior period for another grid.

Figure 2:
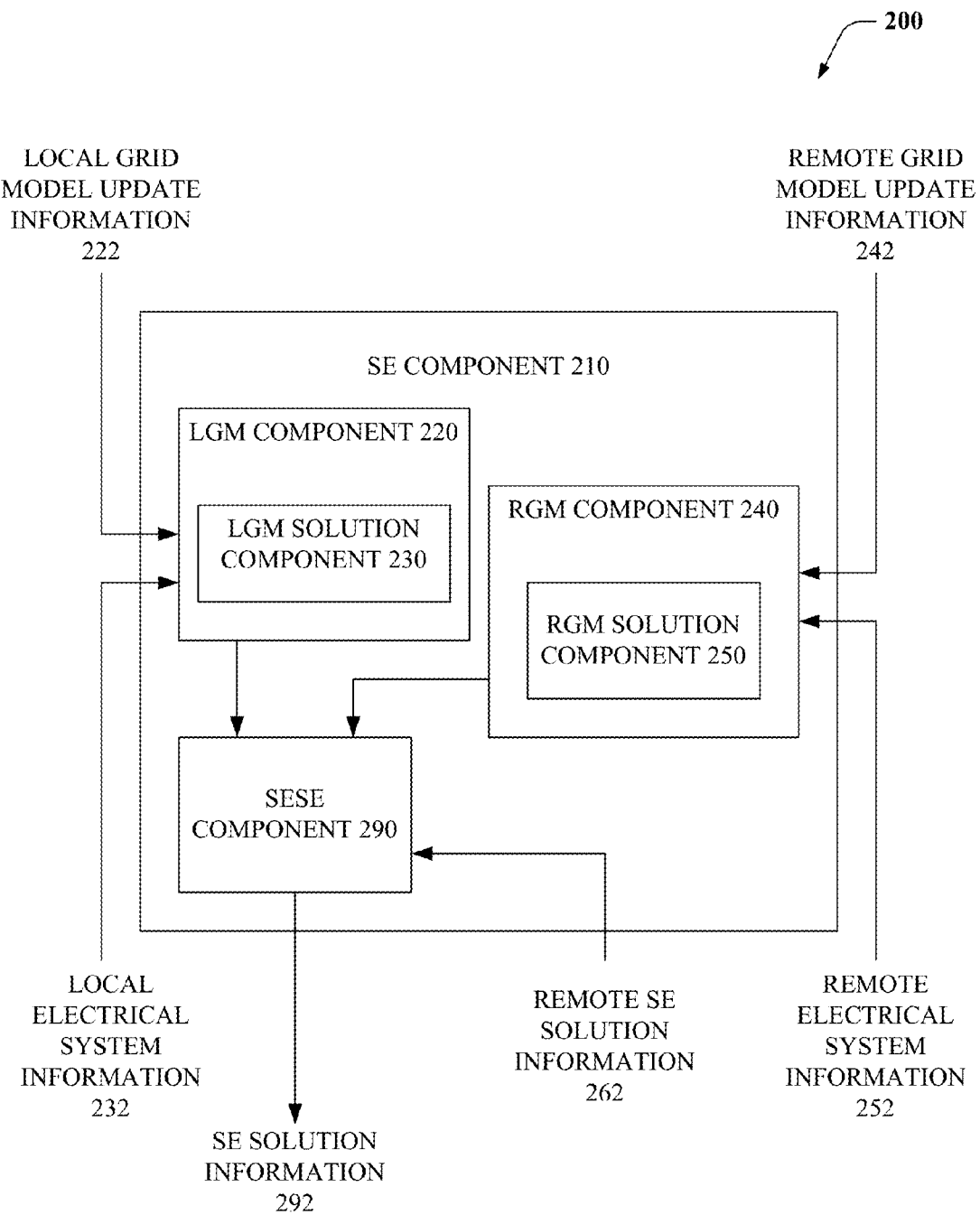
FIG. 2 depicts a system for state estimation for cooperative electrical grids in accordance with aspects of the disclosed subject matter.

FIG. 2 depicts a system 200 for state estimation for cooperative electrical grids in accordance with aspects of the disclosed subject matter. System 200 can comprise SE component 210 that can determine SE solution information 292. SE solution information 292 can reflect a local grid model and interactions with a remote electrical grid.

SE component 210 can include LGM component 220. LGM component 220 can include a LGM of a first real world electrical grid. LGM component 220 can receive local grid model update information 222 to update the LGM. LGM component 220 can facilitate access to a LGM. LGM component 220 can further receive local electrical system information 232. LGM component 220 can also comprise LGM solution component 230, which can determine a local SE solution based, at least in part, on the LGM and local electrical system information 232. The determined local SE solution can reflect the local model and the local grid information without consideration of remote grid interactions. LGM component 220 can be communicatively coupled to SESE component 290.

SE component 210 can include, in parallel with LGM component 220, RGM component 240. RGM component 240 can include a RGM of a second real world electrical grid. RGM component 240 can receive remote grid model update information 242 to update the RGM. RGM component 240 can facilitate access to a RGM. RGM component 240 can further receive remote electrical system information 252. RGM component 240 can also comprise RGM solution component 250, which can locally determine a remote grid model solution set based, at least in part, on the RGM and remote electrical system information 252. The determined remote grid model solution set can reflect the remote model and the remote grid information without consideration of local grid interactions. Of note, the local determination of the remote grid model solution set, based on the remote grid model and measurements, can be flawed as herein particularly disclosed where the remote grid model is stale. RGM component 240 can be communicatively coupled to SESE component 290.

SESE component 290 can receive a local SE solution by way of LGM component 220. SESE component 290 can further receive remote SE solution information 262, wherein remote SE solution information can be based on a recent iteration of the state estimator for the remote electrical grid. SESE component 290 can therefore determine SE solution information 292 based on the local SE solution and remote SE solution information 262. SE solution information 292 can thus reflect the local electrical grid in light of the condition of the remote electrical grid. In an aspect, remote SE solution information 262 can include estimated values that can be employed as pseudo-measurements by SESE component 290 in determining SE solution information 292.

Additionally, SESE component 290 can receive a remote grid model solution set by way of RGM component 240. The remote grid model solution set received by way of RGM component 240 can be locally computed based on an RGM and a received set of remote electrical system information 252. Generally, the RGM is likely to be older and coupled with current or older measurements of remote electrical system information 252. As the RGM ages it becomes increasingly likely to become out of date and stale, such that, determinations of the remote grid model solution set will be similarly inaccurate even though it can be based on instant measurements of remote electrical system information 252. SESE component 290 can also incorporate the remote grid model solution set by way of RGM component 240 into the determination of SE solution information 292.

Where remote SE solution information 262 is available, it can generally be considered more accurate than the remote grid model solution set by way of RGM component 240. As such, remote SE solution information 262 can be used preferentially over the remote grid model solution set by way of RGM component 240 in determining SE solution information 292. In an aspect, where there are several CEGs, not all CEGs will support remote SE solution information 262. As such, SESE component 290 can support determining SE solution information 292 employing remote SE solution information 262, from those CEGs that support remote SE solution information 262, and also employing the remote grid model solution set by way of RGM component 240, from those CEGs that don't support remote SE solution information 262. As such, SE component 210 can support the presently disclosed subject matter and support legacy CEGs that employ conventional sharing of SE models and grid measurements.

Figure 3:
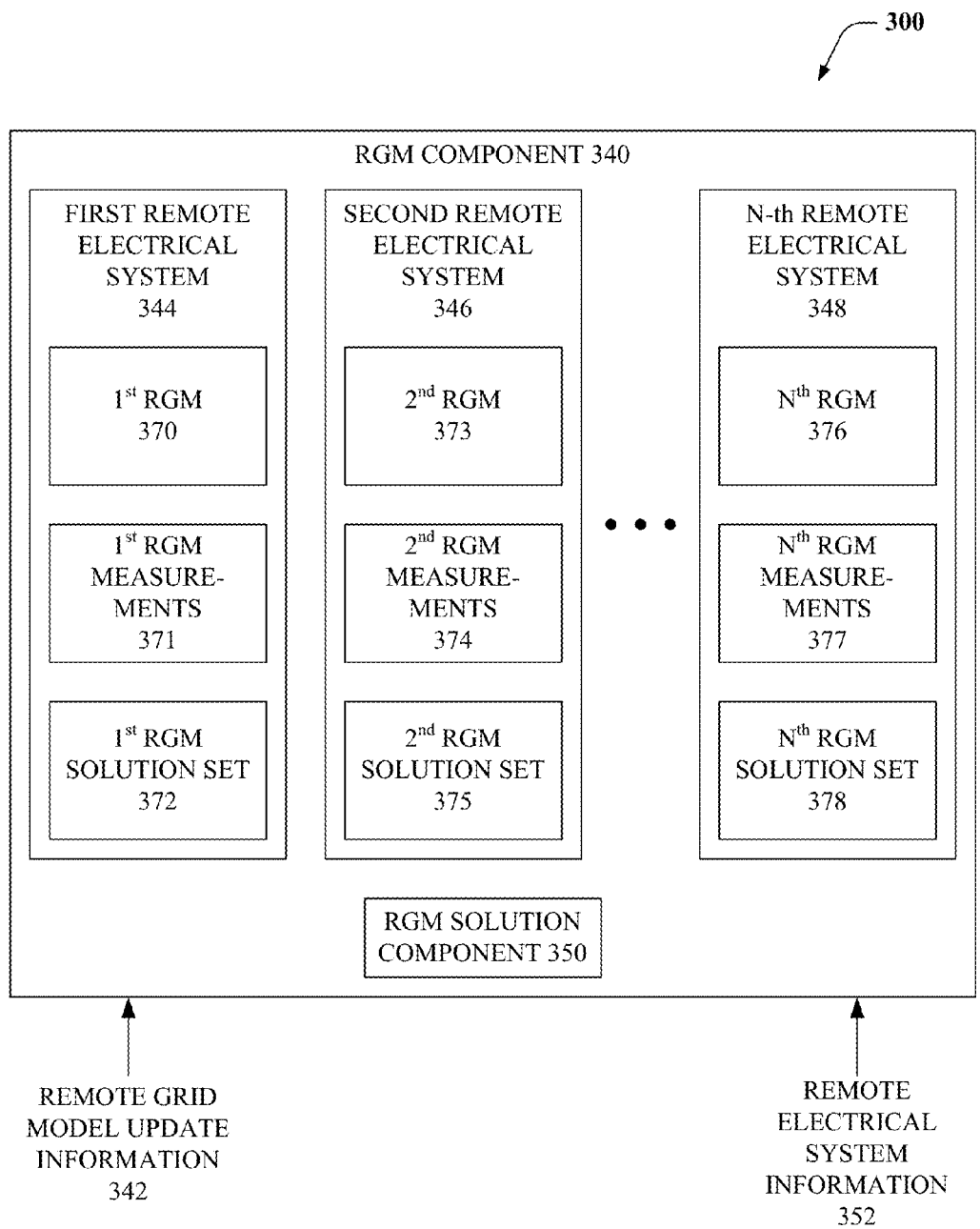
FIG. 3 illustrates a system for facilitating state estimation for cooperative electrical grids in accordance with aspects of the disclosed subject matter.

FIG. 3 illustrates a system 300 for facilitating state estimation for cooperative electrical grids in accordance with aspects of the disclosed subject matter. System 300 can include RGM component 340 that can facilitate determination of SE solution information. RGM component 340 can receive remote electrical grid model update information 342 and remote electrical system information 352. Remote grid model update information 342 can include update(s) to a remote electrical grid model, a new remote grid model, or a replacement remote grid model. Remote grid models can be accessed by RGM component 340. As illustrated, there can be N remote electrical systems for which information can be stored and received by way of RGM component 340, including first remote electrical system 344, second remote electrical system 346, and continuing to N-th remote electrical system 348. In an aspect, RGM component 340 can include zero or more remote electrical systems, e.g., 344-348, for example there can be zero, 1, 2, 3, 4, etc. remote electrical systems.

Information for each remote electrical system can include a RGM. As an example, first RGM 370 can be a RGM for first remote electrical system 344. Similarly, second RGM 373 can be a RGM for second remote electrical system 346. Where there are N remote electrical systems, the N-th RGM can be a RGM for N-th remote electrical system 348. Remote grid model update information 342 can be used to populate, update, or replace one or more of the several RGMs, e.g., 370, 373, 376. In an aspect, the sum of the electrical grid models for CEG's can model less than all cooperative electrical grids of an interconnected electrical system.

Further, remote electrical system information 352 can be correlated to the N remote electrical systems. As such, first RGM measurements 371 can be received as remote electrical system information 352 and correlated to first remote electrical system 344. Similarly, second RGM measurements 374 can be received in remote electrical system information 352 and correlated to second remote electrical system 346. Where there are N remote electrical systems, N-th RGM measurements 377 can be received in remote electrical system information 352 and correlated to N-th remote electrical system 348.

RGM component 340 can also include RGM solution component 350 that can facilitate determination of remote grid model solution sets based on a RGM and corresponding RGM measurements. Wherein each of the N remote electrical systems, 344 to 348, can have an associated RGM and RGM measurements, RGM component 340 can be employed to determine solutions sets for the N remote electrical systems, 344 to 348. As such, first RGM solution set 372 can be determined and correlated to first remote electrical system 344. Similarly, second RGM solution set 375 can be determined and correlated to second remote electrical system 346. Where there are N remote electrical systems, N-th RGM solution set 378 can be determined and correlated to N-th remote electrical system 348. RGM component 340 can facilitate access to the information related to the N remote electrical systems to facilitate determination of SE solution information, e.g., SE solution information 192 or 292.

Figure 4:
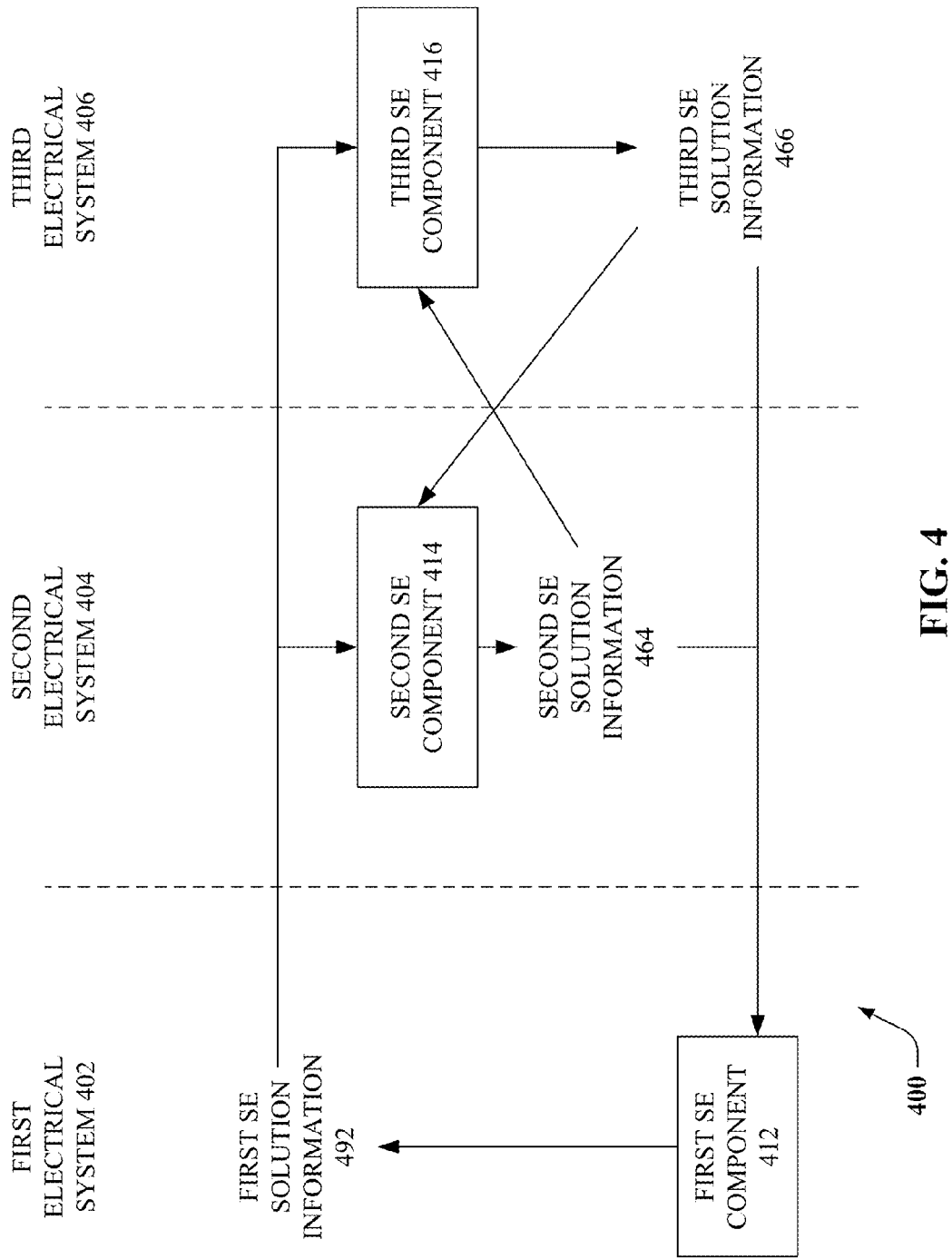
FIG. 4 illustrates a block diagram of an exemplary data flow for state estimation for cooperative electrical grids in accordance with aspects of the disclosed subject matter.

FIG. 4 illustrates a block diagram 400 of an exemplary data flow for state estimation for cooperative electrical grids in accordance with aspects of the disclosed subject matter. Diagram 400 generally illustrates three regions including first electrical system (ES) 402, second electrical system 404, and third electrical system 406. Each region can represent a CEG.

In first ES 402, first SE component 412 can determine first SE solution information 492 based, at least in part, on received second SE solution information 464 and third SE solution information 466. In second ES 404, second SE component 414 can determine second SE solution information 464 based, at least in part, on received first SE solution information 492 and third SE solution information 466. Similarly, in third ES 406, third SE component 416 can determine third SE solution information 466 based, at least in part, on received first SE solution information 492 and second SE solution information 464.

In an aspect, first SE component 412 can employ older SE solution information to facilitate determining first SE solution 492. As an example, second ES 404 can determine second SE solution information on a minute by minute basis, such that the most recent second SE solution information can be up to one minute old before it can be replaced with newer solution information. Continuing the example, third ES 406 can determine third SE solution information hourly, e.g., every 60 minutes, such that the most recent third SE solution information can be up to 60 minutes old before it can be replaced with newer solution information. Where, in the example, first ES 402 determines first SE solution information 492 at an initial time, T(i), that is six minutes after the last update of the third SE solution information 466, the first SE solution information 492 can be based on second SE solution information 464 for T(i−1) and third SE solution information 466 for T(i−6). As such, the first SE solution information 492 for T(i) can be received by second SE component 414 and third SE component 416 for their next determination iterations. Further, an update of first SE solution information 492 at T(i+1) can be based on second SE solution information 464 for T(i) and third SE solution information 466 for T(i−7) because second SE solution information 464 would have been updated during the last minute and third SE solution information 466 would simply have aged another minute. Moreover, an update of first SE solution information 492 at T(i+55) can be based on second SE solution information 464 for T(i+54) and third SE solution information 466 for T(i+54) because both second SE solution information 464 and third SE solution information 466 would have been updated during the preceding minute given that the last update of third SE solution information 466 was at T(−6). Generally, sharing SE solution information can be considered more accurate than the conventional technique of sharing grid models and grid measurements because shared grid models can be updated less frequently than internally maintained grid models used to determine internal SE solution information, e.g., 492, 464, 466, and, as such, the shared grid models can be considered stale in comparison to shared SE solution information.

Figure 5:
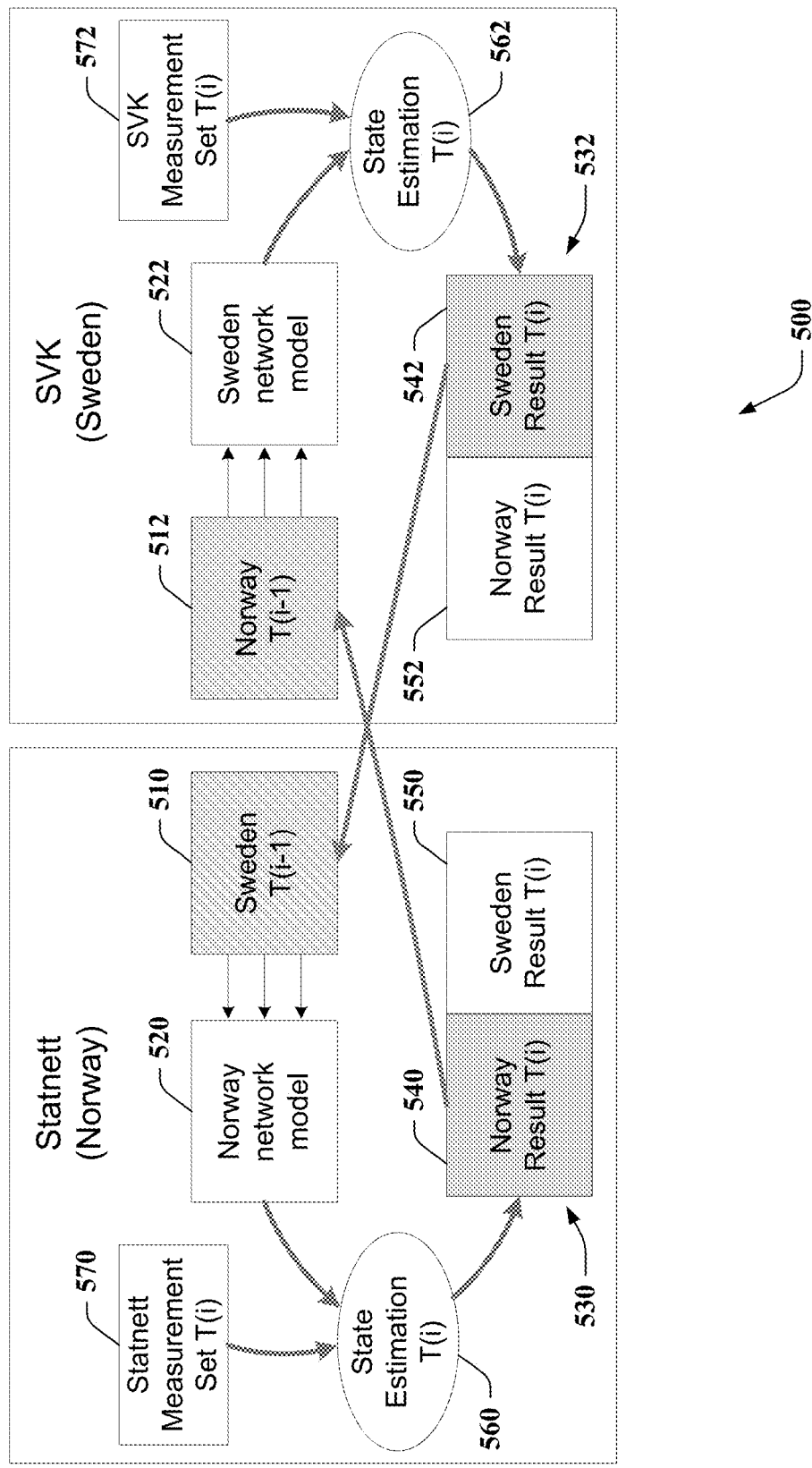
FIG. 5 is a graphic illustration illustrating exemplary data flow for state estimation for cooperative electrical grids in accordance with aspects of the disclosed subject matter.

FIG. 5 is a graphic illustration 500 showing exemplary data flow for state estimation for cooperative electrical grids in accordance with aspects of the disclosed subject matter. Illustration 500 can depict two CEGs, e.g., Statnett (Norway) and SVK (Sweden). These two CEGs geographically share a lengthy physical border and many places for interaction and interconnectivity, e.g., tie points, between the two CEGs across this lengthy border. As seen in illustration 500, the T(i−1) SE solution information of each CEG is employed by the other CEG in computing the T(i) SE solution information that is then shared for the next iteration. Of note, other older SE solution information can also be shared, e.g., T(i−2), T(i−3), . . . , T(i−n), etc., and employed in a similar manner. The illustration showing shared T(i−1) SE solution information in determining the T(i) SE solution information of a CEG is simply for clarity and brevity in this particular exemplary illustration and the disclosed subject matter is not so limited.

As an example, looking at the Statnett CEG, the Swedish T(i−1) SE solution information 510 can be incorporated into the Norway network/grid model 520. In an aspect, the Swedish T(i−1) solution information 510 can be employed as pseudo-measurements, e.g., the estimated values can be treated as measured values for incorporation into the Norway network model 520 used to compute the Statnett T(i) SE solution information 530. The Norway network model 520, including the T(i−1) Swedish SE solution information 510 can be passed to the Statnett state estimator 560 at time T(i). The Statnett state estimator 560 at time T(i) can also receive Statnett electrical grid measurement set 570 for time T(i) and can determine Statnett SE solution information 530 for time T(i) including Norway result 540 at T(i) and Sweden result 550 at T(i). The SE solution information 530 can be employed by Statnett in operation of the Statnett electrical grid, etc. Further, the Norway result 540 portion of the Statnett SE solution information 530 can be made available to the SVK CEG to update the last received remote SE solution information for the next SVK iteration of the SVK state estimator, e.g., 562.

As a correlated second example, looking at the SVK CEG, the Norway T(i−1) SE solution information 512 can be incorporated into the Swedish network/grid model 522. In an aspect, the Norway T(i−1) solution information 512 can be employed as pseudo-measurements. The Swedish network model 522, including the T(i−1) Norway SE solution information 512 can be passed to the SVK state estimator 562 at time T(i). The SVK state estimator 562 at time T(i) can also receive SVK electrical grid measurement set 572 for time T(i) and can determine SVK SE solution information 532 for time T(i) including Swedish result 542 at T(i) and Norway result 552 at T(i). The Swedish SE solution information 532 can be employed by SVK in operation of the SVK electrical grid, etc. Further, the Swedish result 542 portion of the SVK SE solution information 532 can be made available to the Statnett CEG to update the last received remote SE solution information for the next Statnett iteration of the Statnett state estimator, e.g., 560.

Figure 6:
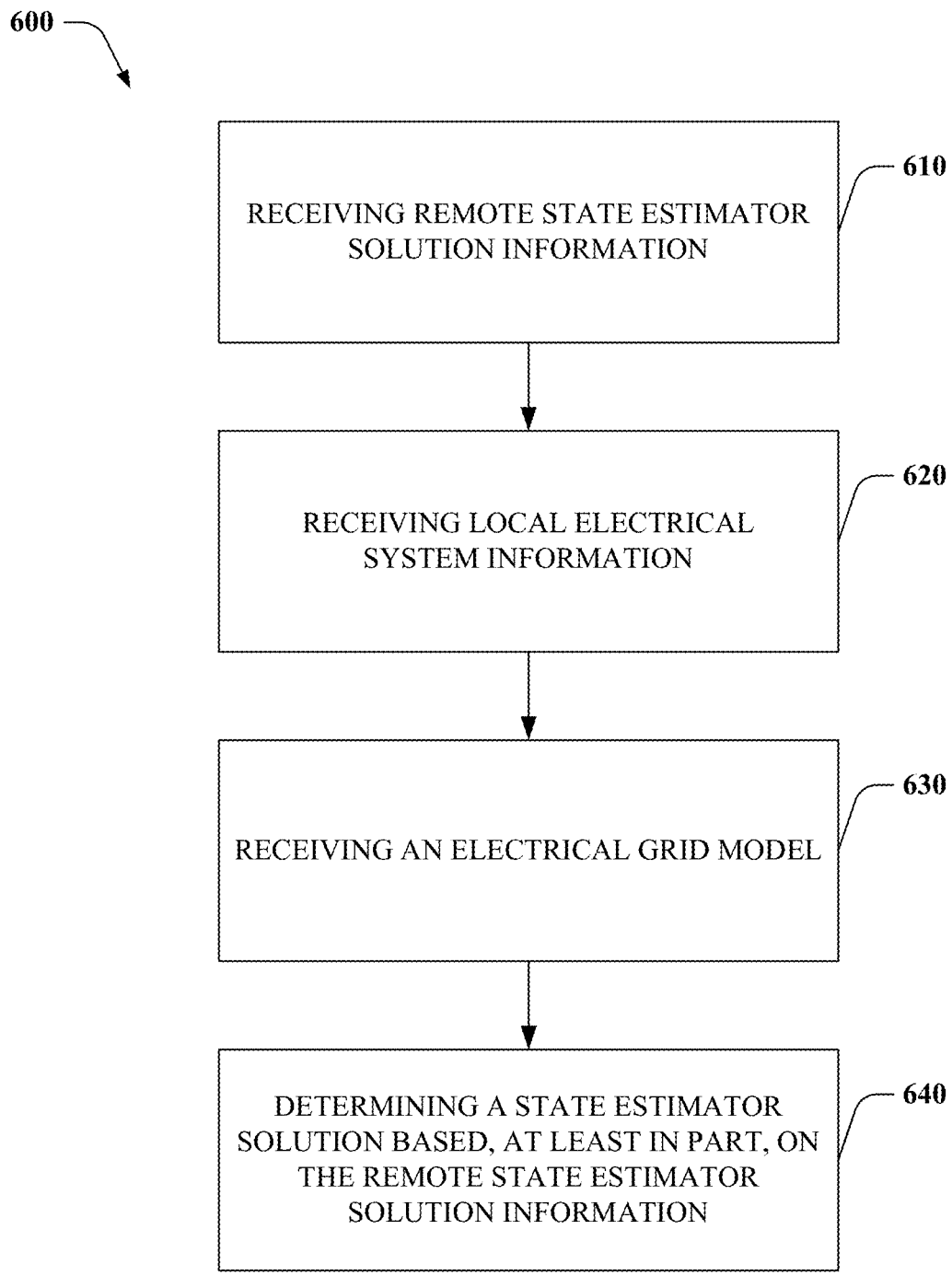
FIG. 6 illustrates a flowchart of procedures for a method facilitating state estimation for cooperative electrical grids in accordance with aspects of the disclosed subject matter.
Figure 7:
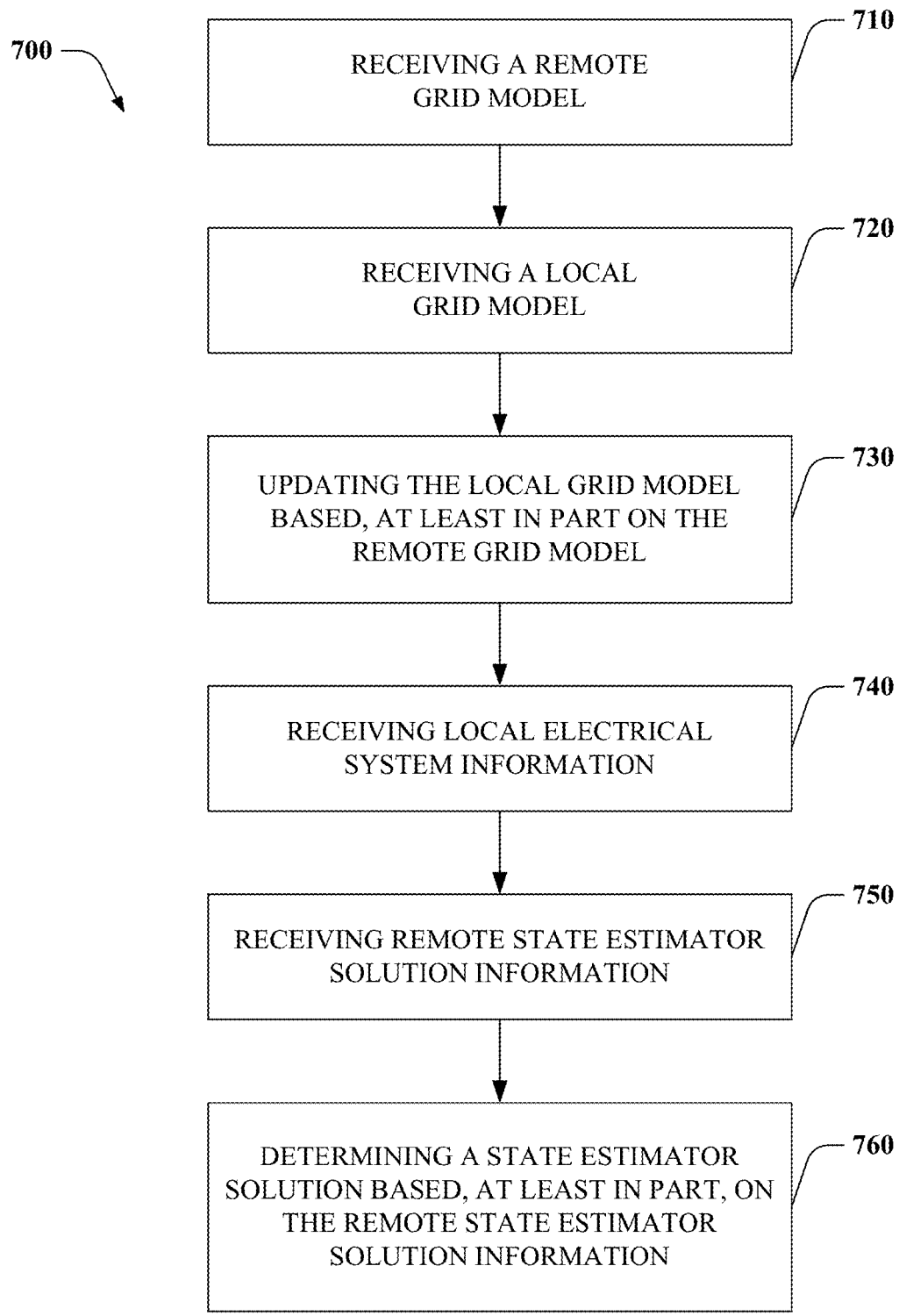
FIG. 7 depicts a flowchart of procedures for a method facilitating state estimation for cooperative electrical grids in accordance with aspects of the disclosed subject matter.
Figure 8:
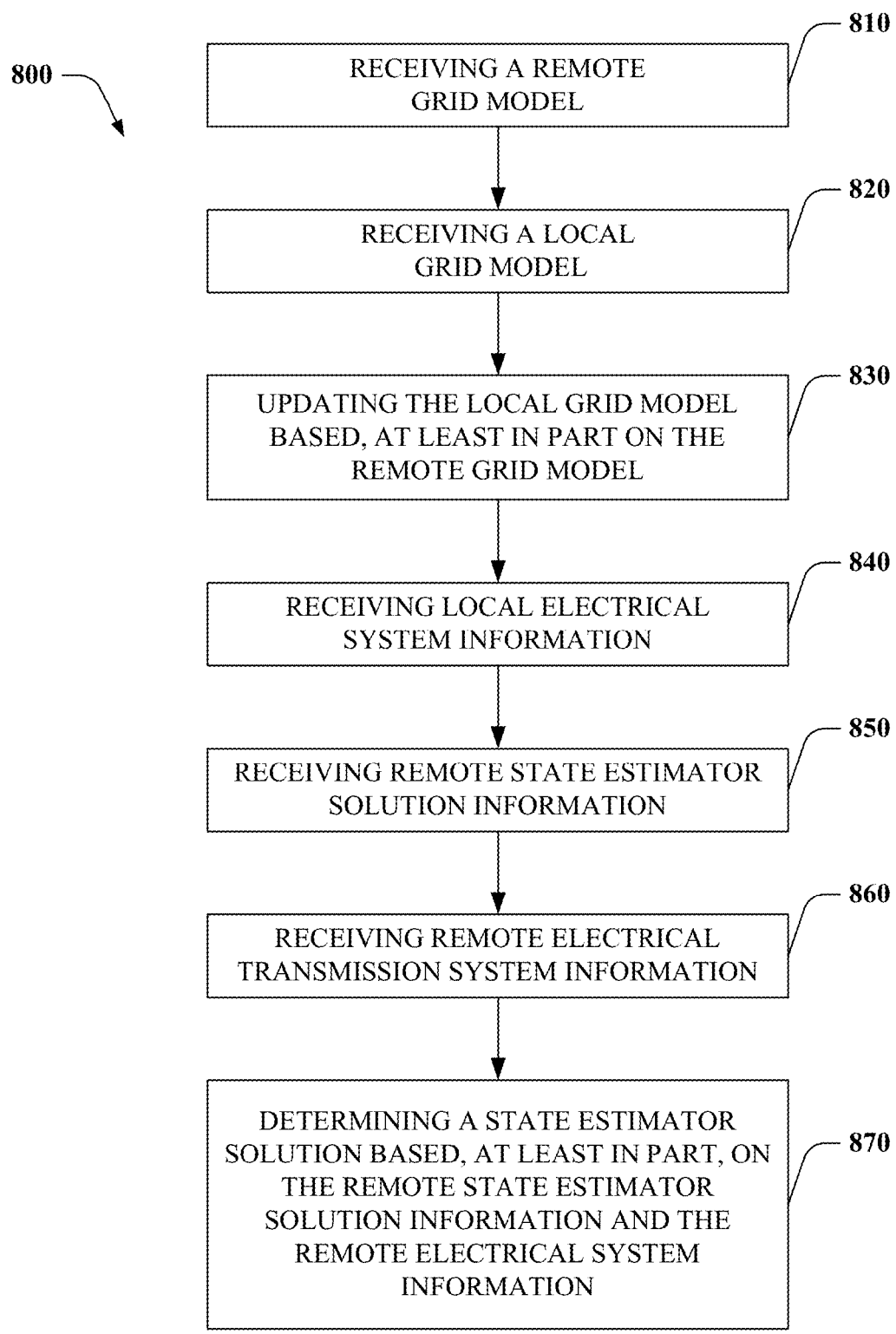
FIG. 8 depicts a flowchart of procedures of a method facilitating state estimation for cooperative electrical grids in accordance with aspects of the disclosed subject matter.

In view of the example system(s) described above, example method(s) that can be implemented in accordance with the disclosed subject matter can be better appreciated with reference to flowcharts in FIG. 6 to FIG. 8. For purposes of simplicity of explanation, example methods disclosed herein are presented and described as a series of acts; however, it is to be understood and appreciated that the claimed subject matter is not limited by the order of acts, as some acts may occur in different orders and/or concurrently with other acts from that shown and described herein. For example, one or more example methods disclosed herein could alternatively be represented as a series of interrelated states or events, such as in a state diagram. Moreover, interaction diagram(s) may represent methods in accordance with the disclosed subject matter when disparate entities enact disparate portions of the methodologies. Furthermore, not all illustrated acts may be required to implement a described example method in accordance with the subject specification. Further yet, two or more of the disclosed example methods can be implemented in combination with each other, to accomplish one or more features or advantages herein described. It should be further appreciated that the example methods disclosed throughout the subject specification are capable of being stored on an article of manufacture to allow transporting and transferring such methods to computers for execution, and thus implementation, by a processor or for storage in a memory.

FIG. 6 illustrates a flowchart of procedures for a method 600 facilitating state estimation for cooperative electrical grids in accordance with aspects of the disclosed subject matter. Method 600 can receive SE solution information from a first remote CEG. The term "remote" indicates that, from the perspective of a "local" CEG, all other CEGs would be "remote" and, as such, the remote SE solution information can be received from a CEG other than a local CEG. As an example, looking back at FIG. 5, from the perspective of Statnett, the SVK CEG can be a remote CEG and the Swedish T(i−1) SE solution information 510 can be considered remote SE solution information received by the local Statnett CEG.

At 620, local electrical system information can be received. Local system information can include measurements of electrical grid conditions for the local electrical grid. As an example, looking back at FIG. 5, from the perspective of Statnett, the Statnett measurement set 570 can be local electrical grid information.

At 630, an electrical grid model can be received. In an aspect, the grid model can be a local CEG grid model. As an example, looking back at FIG. 5, The Norway network/grid model 520 can be a local CEG grid model from the perspective of the Statnett CEG.

At 640, a state estimator solution can be determined. In an aspect, the SE solution can be based in part on the remote SE solution information. At this point method 600 can end. As an example, looking back at FIG. 5, from the perspective of Statnett, the SE solution 530 can be determined and can be based in part on the Swedish T(i−1) SE solution information 510. As another example, looking to FIG. 4, determination of first SE solution information 492 can be based in part on second SE solution information 464 and/or third SE solution information 466. In a further aspect, the SE solution can also be based on a grid model and corresponding electrical system information.

In some aspects, receiving remote SE solution information at 610 can include receiving incremental updates to a previously received set of remote SE solution information. Incremental updates can significantly reduce the amount of data transmitted, where portions thereof include duplicate information between a first and second set of SE solution information. As an example, where T(i−1) SE solution information is identical to T(i−2) SE solution information, an incremental update can be received that simply updates the time stamp and reuses the previously received SE solution information without the need to retransmit the duplicate information. Similarly for example, where the solution information is identical except for a single change in a voltage measurement estimation, the previously received T(i−2) SE solution information can be updated to a T(i−1) SE solution information reflecting the new voltage measurement estimation without retransmitting the duplicate information. Where CEGs are generally considered stable over time, there can be relatively few changes in SE solution information and thus, incremental updates of received remote SE solution information, e.g., at 610, can significantly reduce the amount of information to be received and the time to receive that information.

FIG. 7 depicts a flowchart of procedures for a method 700 facilitating state estimation for cooperative electrical grids in accordance with aspects of the disclosed subject matter. At 710, a remote grid model can be received. At 720, a local grid model can be received. At 730, the local grid model can be updated, based in part, on the remote grid model received at 710. As such, the updated local grid model can reflect the interaction and interconnection with the remote CEG associated with the remote grid model received at 710.

At 740, local electrical system information can be received. At 750, remote SE solution information can be received. At 760, a SE solution can be determined, based, at least in part, on the remote SE solution information received at 750. At this point method 700 can end. In an aspect, the SE solution determined at 760 can be based on the updated local grid model, e.g., from 730, the local electrical gird information, e.g., at 740, and the remote SE solution information from 750. As an example, looking back at FIG. 5, from the perspective of Statnett, the SE solution 530 can be determined and can be based in part on the Swedish T(i−1) SE solution information 510 in addition to the Norway network model 520 and the local measurement set 570.

In an aspect, method 700 illustrates compatibility with conventional techniques in that in method 700, at 710, includes receiving a remote grid model allowing local computation of the state of a remote CEG based on a model and measurements complimentary to the presently disclosed subject matter describing receiving SE solution information from a CEG. In some embodiments, the remote grid model at 710 and the remote SE solution information at 750 can be for the same remote CEG. In other embodiments, the remote grid model at 710 and the remote SE solution information at 750 can be for different remote CEGs. This can allow method 700 to be practiced in groups of CEGs where some of the CEGs support sharing SE solution information and some of the CEGs support sharing of grid models and corresponding grid measurements. As an example, looking to FIG. 5, Norway and Sweden can share SE solution information, as would be received at 750. Where an additional CEG is added, such as Denmark, that additional CEG can provide a Denmark grid model and Denmark electrical grid measurements, such as would be received in part at 710, but may not support sharing of SE solution information. Method 700 thus allows for backwards compatibility with existing technologies while providing the benefits of sharing SE solution information for supporting CEGs.

In another aspect, method 700 provides for updating a local grid model based in part on a remote grid model. This can include updating a local grid model to reflect changes in the boundary conditions for the boundary with the remote CEG associated with the received remote grid model. As an example, a grid model for Norway can have portions associated with tie-points to the Swedish electrical grid. Where the received remote grid model is for Sweden, the portions of the Norway model associated with the tie-points to the Swedish electrical grid can be updated based on the received Swedish grid model. As such, electrical grid measurements for Norway and Sweden can be employed in a state estimator by way of the updated model to estimate grid conditions for the scope of the updated grid model.

In a further aspect, where method 700 provides for updating a local grid model based in part on a remote grid model, this can include updating a local grid model to add the received remote grid model to the local model to expand the local model to encompass both the local and remote CEGs in a single local model. As such, rather than updating boundary portions, the updated local grid model can be a single larger model or can be a multi-part model including partitions within the model for each remote grid model included therein. As an example, updating a local Norway model with a received Swedish model can result in a single grid model reflecting a joint Norway-Swedish electrical grid. As a second example, updating a local Norway model with a received Swedish model can result in a single grid model having a Norway grid model partition and a Sweden grid model partition. These unified and partitioned models can be employed to provide legacy support as disclosed herein.

FIG. 8 depicts a flowchart of procedures of a method 800 facilitating state estimation for cooperative electrical grids in accordance with aspects of the disclosed subject matter. At 810, a remote grid model can be received. At 820, a local grid model can be received. At 830, the local grid model can be updated, based in part, on the remote grid model received at 810. As such, the updated local grid model can reflect the interaction and interconnection with the remote CEG associated with the remote grid model received at 810.

At 840, local electrical transmission system information can be received. At 850, remote SE solution information can be received. At 860, remote electrical transmission system information can be received. At 870, a SE solution can be determined, based, at least in part, on the remote SE solution information received at 850 and the remote electrical transmission system information received at 860. At this point method 800 can end. In an aspect, the SE solution determined at 870 can be based on the updated local grid model, e.g., from 830, the local electrical gird information, e.g., received at 840, and the remote SE solution information from 850. Further, the SE solution determined at 860 can also be based on the remote grid model, e.g., from 810 and the remote electrical gird information, e.g., received at 860.

In an aspect, method 800 illustrates compatibility with conventional techniques in that, at 810, method 800 includes receiving a remote grid model allowing local computation of the state of a remote CEG based the remote electrical transmission system information received at 860. In some embodiments, the remote grid model at 810 and the remote SE solution information at 850 can be for the same remote CEG. In other embodiments, the remote grid model at 810 and the remote SE solution information at 850 can be for different remote CEGs. This can allow method 800 to be practiced in groups of CEGs where some of the CEGs support sharing SE solution information and some of the CEGs support sharing of grid models, e.g., at 810, and corresponding grid measurements, e.g., at 860.

Figure 9:
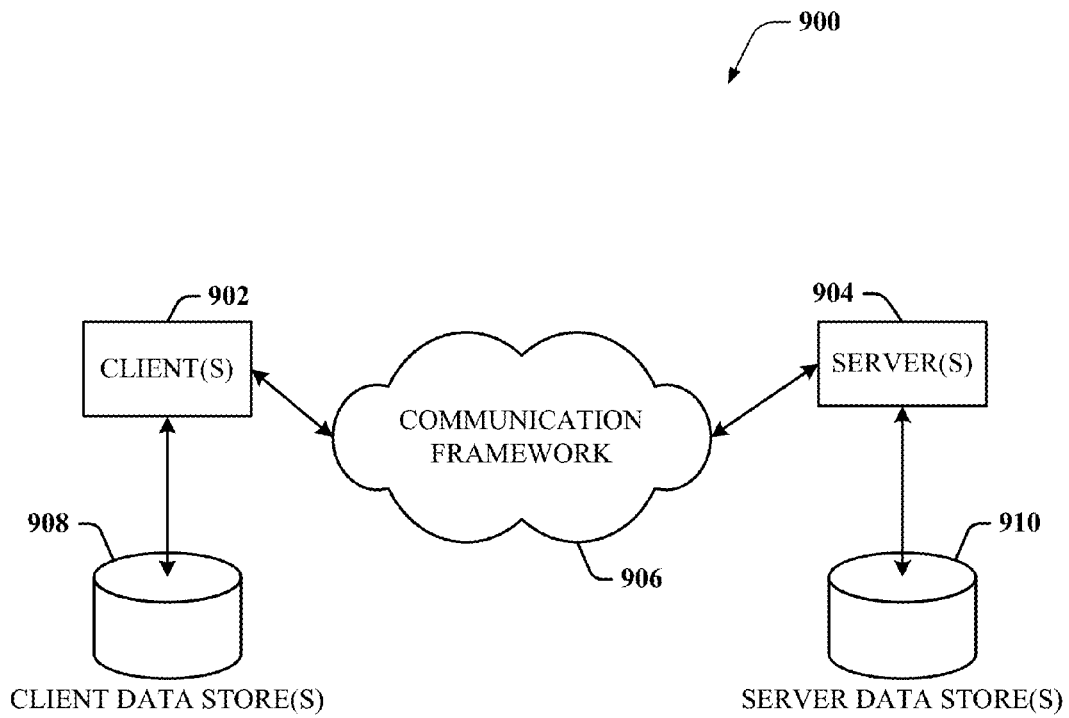
FIG. 9 illustrates a schematic block diagram of an exemplary computing environment for state estimation for cooperative electrical grids in accordance with another aspect.

FIG. 9 illustrates a schematic block diagram 900 of an exemplary computing environment for state estimation for cooperative electrical grids in accordance with another aspect. The system 900 includes one or more client(s) 902. The client(s) 902 can be hardware and/or software (e.g., threads, processes, computing devices). The client(s) 902 can be CEGs that can receive and/or determine SE solution information as disclosed herein.

The system 900 also includes one or more server(s) 904. The server(s) 904 can also be hardware and/or software (e.g., threads, processes, computing devices). One possible communication between a client 902 and a server 904 can be in the form of a data packet adapted to be transmitted between two or more computer processes. The data packet can include a SE solution information, for example. The system 900 includes a communication framework 906 (e.g., a global communication network such as the Internet) that can be employed to facilitate communications between the client(s) 902 and the server(s) 904.

Communications can be facilitated via a wired (including optical fiber) and/or wireless technology. The client(s) 902 can be operatively connected to one or more client data store(s) 908 that can be employed to store information local to the client(s) 902 (e.g., local and/or remote SE solution information). Similarly, the server(s) 904 can be operatively connected to one or more server data store(s) 910 that can be employed to store information local to the servers 904.

In an aspect, there can be a plurality of clients 902, e.g., a plurality of CEGs, that can share SE solution information with the other CEGs by way of server(s) 904. As an example, Norway and Sweden can each be a separate client communicatively connected to a server 904. Norway can facilitate access to T(i−1) SE solution information for the Norway electrical grid such that Sweden can receive this information. Communicating the information can include transferring the Norway T(i−1) SE solution information from the Norway CEG to the Swedish CEG by way of server 904. The reciprocal can also be achieved such that Swedish T(i−1) SE solution information can be received at the Norway CEG by way of server 904. Further, Server 904, in some embodiments, can store SE solution information on server data store(s) 910. This can facilitate access to the SE solution information by other CEGs, for example, Denmark, Finland, or Russia. Moreover, clients, e.g., Norway and Sweden, can store remote and/or local SE solution information on client data store(s) 908, for example, for use in execution of method 600, 700, 800, etc. In some embodiments, LSEM components, e.g., 120, 220, etc., and/or RSEM components, e.g., 140, 240, etc. can include client data store(s) 908 for storage of SE models, electrical grid measurements, SE solution sets determined from models and measurements, and/or shared SE solution information in accord with the disclosure herein.

Figure 10:
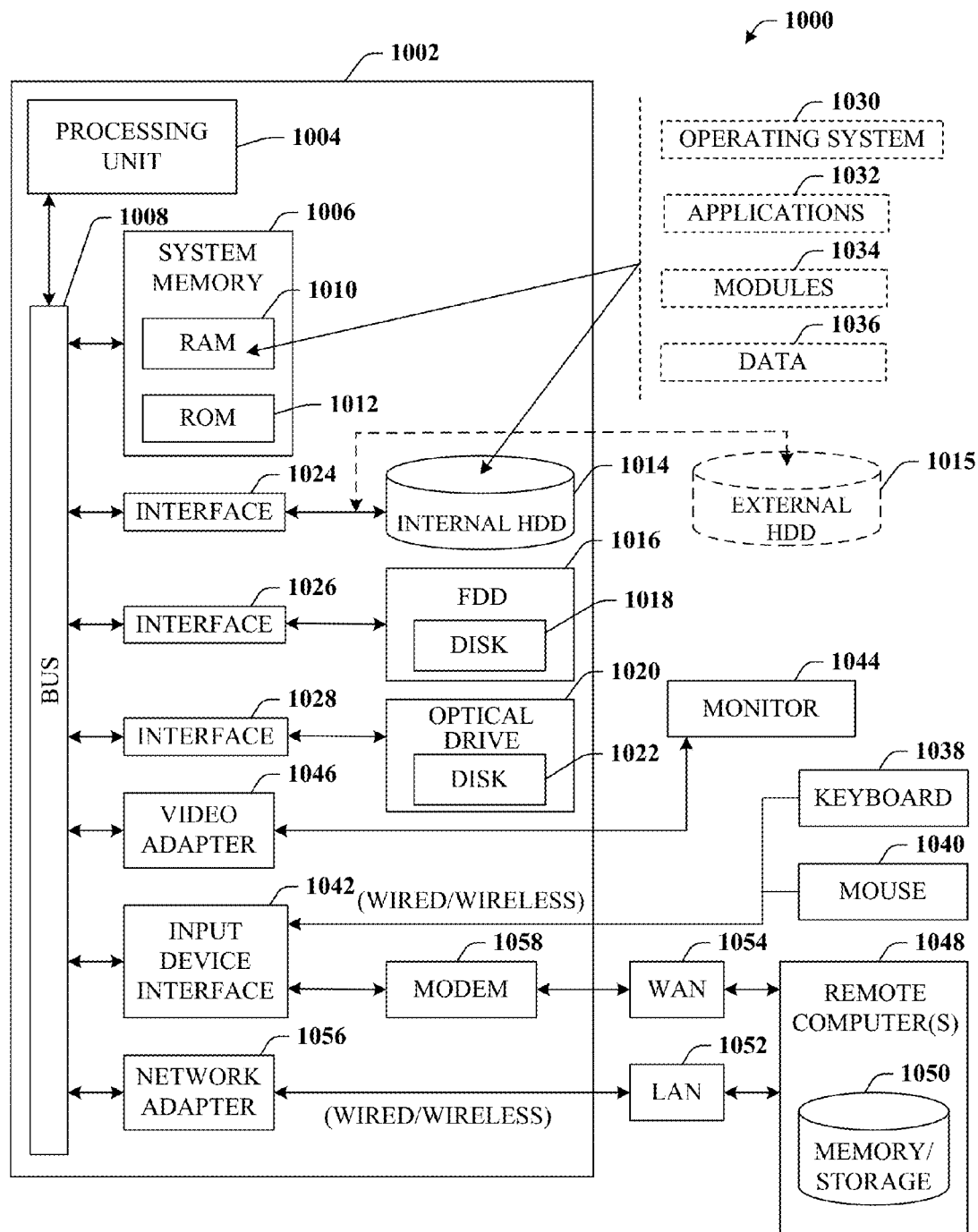
FIG. 10 illustrates a block diagram of a computer operable to execute a portion of the disclosed subject matter.

Referring now to FIG. 10, there is illustrated a block diagram of an exemplary computer system operable to execute the disclosed subject matter. In order to provide additional context for various aspects of the disclosed subject matter, FIG. 10 and the following discussion are intended to provide a brief, general description of a suitable computing environment 1000 in which the various aspects of the disclosed subject matter can be implemented. Additionally, while the disclosed subject matter described above may be suitable for application in the general context of computer-executable instructions that may run on one or more computers, those skilled in the art will recognize that the disclosed subject matter also can be implemented in combination with other program modules and/or as a combination of hardware and software.

Generally, program modules include routines, programs, components, data structures, etc., that perform particular tasks or implement particular abstract data types. Moreover, those skilled in the art will appreciate that the disclosed methods can be practiced with other computer system configurations, including single-processor or multiprocessor computer systems, minicomputers, mainframe computers, as well as personal computers, hand-held computing devices, microprocessor-based or programmable consumer electronics, and the like, each of which can be operatively coupled to one or more associated devices.

The illustrated aspects of the disclosed subject matter can also be practiced in distributed computing environments where certain tasks are performed by remote processing devices that are linked through a communications network. In a distributed computing environment, program modules can be located in both local and remote memory storage devices. As non-limiting examples, electrical distribution system information and/or SE solution information can be accessible by way of the World Wide Web (Web), on corporate servers, on the dedicated communications pathway component(s), etc.

Computing devices typically include a variety of media, which can include computer-readable storage media and/or communications media, which two terms are used herein differently from one another as follows. Computer-readable storage media can be any available storage media that can be accessed by the computer and includes both volatile and nonvolatile media, removable and non-removable media. By way of example, and not limitation, computer-readable storage media can be implemented in connection with any method or technology for storage of information such as computer-readable instructions, program modules, structured data, or unstructured data. Computer-readable storage media can include, but are not limited to, RAM, ROM, EEPROM, flash memory or other memory technology, CD ROM, digital versatile disk (DVD) or other optical disk storage, magnetic cassettes, magnetic tape, magnetic disk storage or other magnetic storage devices, or other tangible and/or non-transitory media which can be used to store desired information. Computer-readable storage media can be accessed by one or more local or remote computing devices, e.g., via access requests, queries or other data retrieval protocols, for a variety of operations with respect to the information stored by the medium.

Communications media typically embody computer-readable instructions, data structures, program modules or other structured or unstructured data in a data signal such as a modulated data signal, e.g., a carrier wave or other transport mechanism, and include any information delivery or transport media. The term "modulated data signal" or signals refers to a signal that has one or more of its characteristics set or changed in such a manner as to encode information in one or more signals. By way of example, and not limitation, communication media include wired media, such as a wired network or direct-wired connection, and wireless media such as acoustic, RF, infrared and other wireless media.

With reference again to FIG. 10, the exemplary environment 1000 for implementing various aspects of the disclosed subject matter includes a computer 1002, the computer 1002 including a processing unit 1004, a system memory 1006 and a system bus 1008. System bus 1008 couples to system components including, but not limited to, the system memory 1006 to the processing unit 1004. The processing unit 1004 can be any of various commercially available processors. Dual microprocessors and other multi-processor architectures may also be employed as the processing unit 1004.

System bus 1008 can be any of several types of bus structure that may further interconnect to a memory bus (with or without a memory controller), a peripheral bus, and a local bus using any of a variety of commercially available bus architectures. The system memory 1006 includes read-only memory (ROM) 1010 and random access memory (RAM) 1012. A basic input/output system (BIOS) is stored in a nonvolatile memory 1010 such as ROM, EPROM, EEPROM, which BIOS contains the basic routines that help to transfer information between elements within the computer 1002, such as during start-up. The RAM 1012 can also include a high-speed RAM such as static RAM for caching data.

The computer 1002 further includes an internal hard disk drive (HDD) 1014, e.g., EIDE, SATA, which internal hard disk drive 1014 may also be configured for external use in a suitable chassis, e.g., 1015, a magnetic floppy disk drive (FDD) 1016, e.g., to read from or write to a removable diskette 1018, and an optical disk drive 1020, e.g., reading a CD-ROM disk 1022 or, to read from or write to other high capacity optical media such as the DVD. The hard disk drive 1014 (or 1015), magnetic disk drive 1016 and optical disk drive 1020 can be connected to the system bus 1008 by a hard disk drive interface 1024, a magnetic disk drive interface 1026 and an optical drive interface 1028, respectively. The interface 1024 for external drive implementations includes at least one or both of Universal Serial Bus (USB) and IEEE1394 interface technologies. Other external drive connection technologies are within contemplation of the subject matter disclosed herein.

The drives and their associated computer-readable media provide nonvolatile storage of data, data structures, computer-executable instructions, and so forth. For the computer 1002, the drives and media accommodate the storage of any data in a suitable digital format. Although the description of computer-readable media above refers to a HDD, a removable magnetic diskette, and a removable optical media such as a CD or DVD, it should be appreciated by those skilled in the art that other types of media which are readable by a computer, such as zip drives, magnetic cassettes, flash memory cards, cartridges, and the like, may also be used in the exemplary operating environment, and further, that any such media may contain computer-executable instructions for performing the methods of the disclosed subject matter.

A number of program modules can be stored in the drives and RAM 1012, including an operating system 1030, one or more application programs 1032, other program modules 1034 and program data 1036. All or portions of the operating system, applications, modules, and/or data can also be cached in the RAM 1012. It is appreciated that the disclosed subject matter can be implemented with various commercially available operating systems or combinations of operating systems.

A user can enter commands and information into the computer 1002 through one or more wired/wireless input devices, e.g., a keyboard 1038 and a pointing device, such as a mouse 1040. Other input devices (not shown) may include a microphone, an IR remote control, a joystick, a game pad, a stylus pen, touch screen, or the like. These and other input devices are often connected to the processing unit 1004 through an input device interface 1042 that is coupled to the system bus 1008, but can be connected by other interfaces, such as a parallel port, an IEEE1394 serial port, a game port, a USB port, an IR interface, etc.

A monitor 1044 or other type of display device is also connected to the system bus 1008 via an interface, such as a video adapter 1046. In addition to the monitor 1044, a computer typically includes other peripheral output devices (not shown), such as speakers, printers, etc.

The computer 1002 may operate in a networked environment using logical connections via wired and/or wireless communications to one or more remote computers, such as a remote computer(s) 1048. For example, powerline type communications can allow control nodes of an electrical distribution system to share information. As a second example, cellular type communications can be employed, e.g., as a wireless communications modality disclosed hereinabove. The remote computer(s) 1048 can be a workstation, a server computer, a router, a personal computer, a mobile device, portable computer, microprocessor-based entertainment appliance, a peer device or other common network node, and typically includes many or all of the elements described relative to the computer 1002, although, for purposes of brevity, only a memory/storage device 1050 is illustrated. The logical connections depicted include wired/wireless connectivity to a local area network (LAN) 1052 and/or larger networks, e.g., a wide area network (WAN) 1054. Such LAN and WAN networking environments are commonplace in offices and companies, and facilitate enterprise-wide computer networks, such as intranets, all of which may connect to a global communications network, e.g., the Internet.

When used in a LAN networking environment, the computer 1002 is connected to the local network 1052 through a wired and/or wireless communication network interface or adapter 1056. The adapter 1056 may facilitate wired or wireless communication to the LAN 1052, which may also include a wireless access point disposed thereon for communicating with the wireless adapter 1056.

When used in a WAN networking environment, the computer 1002 can include a modem 1058, or is connected to a communications server on the WAN 1054, or has other means for establishing communications over the WAN 1054, such as by way of the Internet. The modem 1058, which can be internal or external and a wired or wireless device, is connected to the system bus 1008 via the serial port interface 1042. In a networked environment, program modules depicted relative to the computer 1002, or portions thereof, can be stored in the remote memory/storage device 1050. It will be appreciated that the network connections shown are exemplary and other means of establishing a communications link between the computers can be used.

The computer 1002 is operable to communicate with any wireless devices or entities operatively disposed in wireless communication, e.g., a printer, scanner, desktop and/or portable computer, portable data assistant, communications satellite, any piece of equipment or location associated with a wirelessly detectable tag, e.g., a kiosk, news stand, restroom, etc., and telephone. This includes at least Wi-Fi and Bluetooth™ wireless technologies. Thus, the communication can be a predefined structure as with a conventional network or simply an ad hoc communication between at least two devices.

As used herein, the term "communicatively" coupled or similar terms indicates that the coupling can at least support communication between components while the term "energetically" connected or similar terms indicates that the connection can at least support energy transfer between components. As such, an energetic connection is not strictly limited to energy transfer, unless otherwise indicated. An energetic connection can therefore also have a communicative aspect. As a non-limiting example, electrical energy can be transferred from a distribution transformer to a smart meter by way of mains conductors and information can be carried over the same mains conductors, e.g., power line communication.

As used in this application, the terms "component," "system," "platform," "layer," "selector," "interface," and the like are intended to refer to a computer-related entity or an entity related to an operational apparatus with one or more specific functionalities, wherein the entity can be either hardware, a combination of hardware and software, software, or software in execution. As an example, a component may be, but is not limited to being, a process running on a processor, a processor, an object, an executable, a thread of execution, a program, and/or a computer. By way of illustration, both an application running on a server and the server can be a component. One or more components may reside within a process and/or thread of execution and a component may be localized on one computer and/or distributed between two or more computers. Also, these components can execute from various computer readable media having various data structures stored thereon. The components may communicate via local and/or remote processes such as in accordance with a signal having one or more data packets, e.g., data from one component interacting with another component in a local system, distributed system, and/or across a network such as the Internet with other systems via the signal. As another example, a component can be an apparatus with specific functionality provided by mechanical parts operated by electric or electronic circuitry, which is operated by a software or firmware application executed by a processor, wherein the processor can be internal or external to the apparatus and executes at least a part of the software or firmware application. As yet another example, a component can be an apparatus that provides specific functionality through electronic components without mechanical parts, the electronic components can include a processor therein to execute software or firmware that confers at least in part the functionality of the electronic components.

Moreover, the word "exemplary" is used herein to mean serving as an example, instance, or illustration. Any aspect or design described herein as "exemplary" is not necessarily to be construed as preferred or advantageous over other aspects or designs. Rather, use of the word exemplary is intended to present concepts in a concrete fashion.

In addition, the term "or" is intended to mean an inclusive "or" rather than an exclusive "or." That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. Moreover, articles "a" and "an" as used in the subject specification and annexed drawings should generally be construed to mean "one or more" unless specified otherwise or clear from context to be directed to a singular form.

Furthermore, the terms "user," "subscriber," "customer," "consumer," "prosumer," "agent," and the like are employed interchangeably throughout the subject specification, unless context warrants particular distinction(s) among the terms. It should be appreciated that such terms can refer to human entities or automated components supported through artificial intelligence, e.g., a capacity to make inference based on complex mathematical formalisms, which can provide simulated vision, sound recognition and so forth.

As used herein, the terms "infer" or "inference" generally refer to the process of reasoning about or inferring states of the system, environment, and/or user from a set of observations as captured via events and/or data. Inference can be employed to identify a specific context or action, or can generate a probability distribution over states, for example. The inference can be probabilistic—that is, the computation of a probability distribution over states of interest based on a consideration of data and events. Inference can also refer to techniques employed for composing higher-level events from a set of events and/or data. Such inference results in the construction of new events or actions from a set of observed events and/or stored event data, whether or not the events are correlated in close temporal proximity, and whether the events and data come from one or several event and data sources.

Wi-Fi, or Wireless Fidelity, allows connection to the Internet from a couch at home, a bed in a hotel room, or a conference room at work, without wires. Wi-Fi is a wireless technology similar to that used in a cell phone that enables such devices, e.g., computers, to send and receive data indoors and out; anywhere within the range of a base station. Wi-Fi networks use radio technologies called IEEE802.11 (a, b, g, n, etc.) to provide secure, reliable, fast wireless connectivity. A Wi-Fi network can be used to connect computers to each other, to the Internet, and to wired networks (which use IEEE802.3 or Ethernet). Wi-Fi networks operate in the unlicensed 2.4 and 5 GHz radio bands, at an 11 Mbps (802.11b) or 54 Mbps (802.11a) data rate, for example, or with products that contain both bands (dual band), so the networks can provide real-world performance similar to the basic "10BaseT" wired Ethernet networks used in many offices.

Various aspects or features described herein can be implemented as a method, apparatus, or article of manufacture using standard programming and/or engineering techniques. In addition, various aspects disclosed in the subject specification can also be implemented through program modules stored in a memory and executed by a processor, or other combination of hardware and software, or hardware and firmware. The term "article of manufacture" as used herein is intended to encompass a computer program accessible from any computer-readable device, carrier, or media. For example, computer readable media can include but are not limited to magnetic storage devices, e.g., hard disk, floppy disk, magnetic strips, etc., optical disks, e.g., compact disc (CD), digital versatile disc (DVD), blu-ray disc (BD), etc., smart cards, and flash memory devices, e.g., card, stick, key drive, etc. Additionally it should be appreciated that a carrier wave can be employed to carry computer-readable electronic data such as those used in transmitting and receiving electronic mail or in accessing a network such as the internet or a local area network (LAN). Of course, those skilled in the art will recognize many modifications may be made to this configuration without departing from the scope or spirit of the disclosed subject matter.

As it employed in the subject specification, the term "processor" can refer to substantially any computing processing unit or device comprising, but not limited to comprising, single-core processors; single-processors with software multithread execution capability; multi-core processors; multi-core processors with software multithread execution capability; multi-core processors with hardware multithread technology; parallel platforms; and parallel platforms with distributed shared memory. Additionally, a processor can refer to an integrated circuit, an application specific integrated circuit (ASIC), a digital signal processor (DSP), a field programmable gate array (FPGA), a programmable logic controller (PLC), a complex programmable logic device (CPLD), a discrete gate or transistor logic, discrete hardware components, or any combination thereof designed to perform the functions described herein. Processors can exploit nano-scale architectures such as, but not limited to, molecular and quantum-dot based transistors, switches and gates, in order to optimize space usage or enhance performance of user equipment. A processor also can be implemented as a combination of computing processing units.

In the subject specification, terms such as "store," "data store," "data storage," "database," "repository," and substantially any other information storage component relevant to operation and functionality of a component, refer to "memory components," or entities embodied in a "memory" or components comprising the memory. It will be appreciated that the memory components described herein can be either volatile memory or nonvolatile memory, or can include both volatile and nonvolatile memory. In addition, memory components or memory elements can be removable or stationary. Moreover, memory can be internal or external to a device or component, or removable or stationary. Memory can include various types of media that are readable by a computer, such as hard-disc drives, zip drives, magnetic cassettes, flash memory cards or other types of memory cards, cartridges, or the like.

By way of illustration, and not limitation, nonvolatile memory can include read only memory (ROM), programmable ROM (PROM), electrically programmable ROM (EPROM), electrically erasable ROM (EEPROM), or flash memory. Volatile memory can include random access memory (RAM), which acts as external cache memory. By way of illustration and not limitation, RAM is available in many forms such as synchronous RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), and direct Rambus RAM (DRRAM). Additionally, the disclosed memory components of systems or methods herein are intended to comprise, without being limited to comprising, these and any other suitable types of memory.

What has been described above includes examples of the various embodiments. It is, of course, not possible to describe every conceivable combination of components or methodologies for purposes of describing the embodiments, but one of ordinary skill in the art may recognize that many further combinations and permutations are possible. Accordingly, the detailed description is intended to embrace all such alterations, modifications, and variations that fall within the spirit and scope of the appended claims.

In particular and in regard to the various functions performed by the above described components, devices, circuits, systems and the like, the terms (including a reference to a "means") used to describe such components are intended to correspond, unless otherwise indicated, to any component which performs the specified function of the described component, e.g., a functional equivalent, even though not structurally equivalent to the disclosed structure, which performs the function in the herein illustrated exemplary aspects of the embodiments. In this regard, it will also be recognized that the embodiments includes a system as well as a computer-readable medium having computer-executable instructions for performing the acts and/or events of the various methods.

In addition, while a particular feature may have been disclosed with respect to only one of several implementations, such feature may be combined with one or more other features of the other implementations as may be desired and advantageous for any given or particular application. Furthermore, to the extent that the terms "includes," and "including" and variants thereof are used in either the detailed description or the claims, these terms are intended to be inclusive in a manner similar to the term "comprising."

What is claimed is:

1. A system comprising:
a memory that stores executable instructions; and
a processor, communicatively coupled to the memory, that facilitates execution of the executable instructions to at least:
receive a first model of a first electrical grid;
receive first electrical grid information associated with the first electrical grid at a first time;
receive second state estimator solution information associated with a second electrical grid at a second time, wherein the second electrical grid is different than the first electrical grid; and
determine first state estimator solution information based on the first model of the first electrical grid, the first electrical grid information, and the second state estimator solution information.

2. The system of claim 1, wherein the first electrical grid information includes measurements of electrical characteristics of the first electrical grid for the first time.

3. The system of claim 2, wherein the second time precedes the first time.

4. The system of claim 3, wherein the first time and the second time are selected from a set of periodic times and the first time is a most recent time of the set of periodic times.

5. The system of claim 4, wherein the second time is the second most recent time of the set of periodic times.

6. The system of claim 1, wherein the second state estimator solution information is based on a second model of the second electrical grid and second electrical grid information associated with the second electrical grid.

7. The system of claim 6, wherein the second state estimator solution information is further based on another state estimator solution information associated with an electrical grid other than the second electrical grid.

8. The system of claim 7, wherein the electrical grid other than the second electrical grid is a third electrical grid.

9. The system of claim 1, wherein the determination of the first state estimator solution information is further based on another model of another electrical grid other than the first electrical grid and other electrical grid information associated with another electrical grid.

10. The system of claim 9, wherein the another electrical grid is a third electrical grid.

11. The system of claim 1, wherein the processor further facilitates the execution of the executable instructions to update the first model prior to a determination of the first state estimator solution information by the system.

12. The system of claim 11, wherein the update is an incremental update.

13. The system of claim 1, wherein the second state estimator solution information is an incremental update of previous state estimator solution information associated with the second electrical grid.

14. A method, comprising:
receiving, by a system comprising at least one processor, a first model of a first electrical grid;
receiving, by the system, first electrical grid information associated with the first electrical grid at a first time;
receiving, by the system, second state estimator solution information associated with a second electrical grid at a second time and wherein the second electrical grid is different than the first electrical grid; and
determining, by the system, first state estimator solution information based on the first model, first electrical grid information, and second state estimator solution information.

15. The method of claim 14, wherein the determining includes determining the second state estimator solution information based on a second model of the second electrical grid and second electrical grid information associated with the second electrical grid.

16. The method of claim 15, wherein the determining further includes determining the second state estimator solution information based on third state estimator information associated with an electrical grid other than the second electrical grid.

17. The method of claim 16, wherein the determining further includes determining the second state estimator solution information based on the first electrical grid.

18. The method of claim 14, wherein the receiving the first electrical grid information comprises receiving measurements of electrical characteristics of the first electrical grid for the first time, and further comprising:
associating the second state estimator solution information with the second electrical grid for the second time preceding the first time.

19. The method of claim 14, further comprising:
updating the first model prior to determining the first state estimator solution information.

20. A non-transitory computer-readable storage medium having executable instructions stored thereon that, in response to execution, cause a device including a processor to perform operations, comprising:
receiving a first model of a first electrical grid;
receiving electrical grid information associated with the first electrical grid at a first time;
receiving second state estimator solution information associated with a second electrical grid at a second time; and
determining first state estimator solution information based on the first model, the electrical grid information at the first time, and the second state estimator solution information at the second time.

21. The non-transitory computer-readable storage medium of claim 20, wherein the first electrical grid information includes measurements of electrical characteristics of the first electrical grid for the first time.

22. The non-transitory computer-readable storage medium of claim 20, wherein the second time precedes the first time.

23. The non-transitory computer-readable storage medium of claim 20, wherein the second state estimator solution information is based on a second model of the second electrical grid and second electrical grid information associated with the second electrical grid.

24. The non-transitory computer-readable storage medium of claim 23, wherein the second state estimator solution information is further based on third state estimator solution information associated with an electrical grid other than the second electrical grid and the first electrical grid.

25. The non-transitory computer-readable storage medium of claim 24, wherein the electrical grid other than the second electrical grid and the first electrical grid is a third electrical grid.

* * * * *

UNITED STATES PATENT AND TRADEMARK OFFICE
CERTIFICATE OF CORRECTION

Page 1 of 1

PATENT NO. : 9,281,686 B2
APPLICATION NO. : 13/670073
DATED : March 8, 2016
INVENTOR(S) : Jay Payne Britton It is certified that error appears in the above-identified patent and that said Letters Patent is hereby corrected as shown below:

Title Page

Item (73) in the Assignee, please change:

General Electric Technology GmbH, Baden (CH)

-- to --

ALSTOM Technology Ltd., Baden (CH)

Signed and Sealed this
Third Day of May, 2016

Michelle K. Lee
*Director of the United States Patent and Trademark Office*